United States Patent [19]

Nath et al.

[11] Patent Number: 4,633,033

[45] Date of Patent: Dec. 30, 1986

[54] PHOTOVOLTAIC DEVICE AND METHOD

[75] Inventors: Prem Nath, Rochester; Timothy J. Barnard, Lake Orion; Dominic Crea, Mt. Clemens, all of Mich.

[73] Assignee: Energy Conversion Devices, Inc., Troy, Mich.

[21] Appl. No.: 699,523

[22] Filed: Feb. 8, 1985

[51] Int. Cl.[4] ...................... H01L 31/06; H01L 31/18
[52] U.S. Cl. .................................... 136/256; 136/249; 136/258; 29/572; 357/30; 357/65; 357/71; 427/74
[58] Field of Search .......... 136/249 TJ, 256, 258 AM, 136/260; 357/30, 65, 71; 427/74; 29/572

[56] References Cited

U.S. PATENT DOCUMENTS

| | | | |
|---|---|---|---|
| 4,272,641 | 6/1981 | Hanak | 136/249 TJ |
| 4,542,255 | 9/1985 | Tanner et al. | 136/249 MS |
| 4,590,327 | 5/1986 | Nath et al. | 136/256 |

Primary Examiner—Aaron Weisstuch
Attorney, Agent, or Firm—Ronald W. Citkowski; Marvin S. Siskind

[57] ABSTRACT

An improved photovoltaic device exhibiting increased tolerance of shorting and shunting defects includes: a substrate having a semiconductor body disposed thereupon, a current collecting structure such as a bus-grid structure disposed upon the semiconductor body and a transparent conductive electrode overlying the semiconductor body and the current collecting structure. The photovoltaic device may also include a layer of low electrical conductivity material disposed beneath at least portions of the current collecting structure to prevent electrical contact between said structure and defective regions of the device occuring therebelow. Also disclosed are methods for the fabrication of the improved device.

35 Claims, 5 Drawing Figures

PHOTOVOLTAIC DEVICE AND METHOD

FIELD OF THE INVENTION

This invention relates generally to photovoltaic devices, and especially to thin film photovoltaic devices. More particularly, the present invention relates to improvements in the disposition of the upper electrode of the photovoltaic device relative to the current collecting bus grid structure thereof. The invention is particularly useful in large area, thin film photovoltaic devices, insofar as it provides a structure and method for minimizing the effect of current shunting defects which may be present in the photovoltaic devices.

BACKGROUND OF THE INVENTION

Single crystal photovoltaic devices, especially silicon photovoltaic devices, have been utilized for some time as sources of electrical power because they are inherently non-polluting, silent, and consume no expendable natural resources in their operation. However, the utility of such devices is limited by problems associated with the manufacture thereof. More particularly, single crystal materials (1) are difficult to produce in sizes substantially larger than several inches in diameter, (2) are thicker and heavier than their thin film counterparts; and (3) are expensive and time consuming to fabricate.

Recently, considerable efforts have been made to develop processes for depositing amorphous semiconductor films, each of which can encompass relatively large areas, and which can be doped to form p-type and n-type materials for the production of p-i-n type devices substantially equivalent to those produced by their crystalline counterparts. It is to be noted that the term "amorphous" as used herein, includes all materials or alloys which have long range disorder, although they may have short or intemediate range order or even contain, at times, crystalline inclusions.

For many years, such work with amorphous silicon or germanium films was substantially unproductive because of the presence therein of microvoids and dangling bonds which produce a high density of localized states in the energy gap, which states are derogatory to the electrical properties of such films. Initially, the reduction of the localized states was accomplished by glow discharge deposition of amorphous silicon films, wherein silane ($SiH_4$) gas is passed through a reaction tube where the gas is decomposed by a radio frequency (r.f.) glow discharge and deposited on a substrate maintained at a temperature of about 500–600 degrees K (227–327 degrees C.). The material so deposited on the substrate is an intrinsic amorphous material consisting of silicon and hydrogen. To produce a doped amorphous material an N-dopant such as phosphine gas ($PH_3$), or a P-dopant such as diborane ($B_2H_6$) gas, is premixed with the silane gas and passed through the glow discharge reaction tube under the same operating conditions. The material so deposited includes supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to substantially reduce the density of the localized states in the energy gap, thereby causing the amorphous material to more nearly approximate the corresponding crystalline material.

It is now possible to prepare by glow discharge or vapor deposition thin film amorphous silicon or germanium alloys in large areas, said alloys possessing acceptable concentrations of localized states in the energy gaps thereof and high quality electronic properties. Suitable techniques are fully described in U.S. Pat. No. 4,226,898, entitled "Amorphous Semiconductor Equivalent to Crystalline Semiconductors," to Stanford R. Ovshinsky and Arun Madan which issued Oct. 7, 1980 and in U.S. Pat. No. 4,217,374, under the same title to Stanford R. Ovshinsky and Masatsugu Izu, which issued on Aug. 12, 1980 and U.S. Pat. No. 4,517,223 Stanford R. Ovshinsky, David D. Allred, Lee Walter and Stephen J. Hudgens entitled "Method of Making Amorphous Semiconductor Alloys and Devices Using Microwave Energy," which patents are assigned to the assignees of the instant invention, the disclosure of which is incorporated herein by reference. As disclosed in these patents, it is believed that fluorine introduced into the amorphous semiconductor operates to substantially reduce the density of the localized states therein and facilitates the addition of other alloying materials.

Owing to the small size of its atoms, activated fluorine is believed to readily diffuse into, and bond to, amorphous matrix forming materials such as silicon so as to substantially decrease the density of localized defect states therein. The fluorine is believed to bond to the dangling bonds of the matrix material and form a partially ionic, stable bond with flexible bonding angles, thereby resulting in a more stable and more efficient compensation or alteration than could be effected by hydrogen or other compensating or altering agents which were previously employed.

Compensation may be achieved with fluorine, alone or in combination with hydrogen, by the addition of such element(s) in even very small quantities (e.g., fractions of one atomic percent). However, the amounts of fluorine and hydrogen most desirably used are of generally much greater than such small percentages. Alloying amounts of fluorine and hydrogen may, for example, be used in a range of 0.1 to 5 percent or greater, so as to form a silicon:hydrogen:fluorine alloy. The alloy thus formed has a lower density of defect states in the energy gap than can be achieved by the mere neutralization of dangling bonds and similar defect states. In particular, it appears that fluorine effects a new structural configuration of an amorphous silicon-containing material and facilitates the addition of other alloying materials, such as germanium. Fluorine is also believed to (1) be an organizer of local structure in the silicon-containing alloy through inductive and ionic effects, and (2) also influence the bonding of hydrogen by acting to decrease the density of the defect states which hydrogen normally contributes. The ionic role that fluorine plays in such an alloy is an important factor in terms of the nearest neighbor relationships.

The concept of utilizing multiple cells, to enhance photovoltaic device efficiency, was disclosed at least as early as 1955 by E. D. Jackson, in U.S. Pat. No. 2,949,498, issued Aug. 16, 1960. The multiple cell structures therein disclosed utilized p-n junction crystalline semiconductor devices. Essentially, the concept is directed to utilizing different band gap devices to more efficiently collect various portions of the solar spectrum and to increase open circuit voltage ($V_{oc}$). The tandem cell device has two or more cells with the light directed serially through each cell, with a large band gap material followed by a smaller band gap material to absorb the light passed through the first cell or layer. By substantially matching the generated currents from each cell, the overall open circuit voltage is the sum of the open circuit voltage of each cell, while the short circuit current remains substantially constant. It should be noted that Jackson employed crystalline semiconductor materials for the fabrication of the stacked cell device; however, it is virtually impossible to match lattice constants of differing crystalline materials. Therefore, it is not possible to fabricate such crystalline tandem structures in a commercially feasible manner. As the assignee of the instant invention has shown, however, such tandem structures are not only possible, but can be economically fabricated in large areas by employing amorphous materials.

It is of obvious commercial importance to be able to mass produce photovoltaic devices such as solar cells. However, with crystalline cells, mass production was limited to batch processing techniques by the inherent growth requirements of the crystals. Unlike crystalline silicon, amorphous silicon alloys can be deposited in multiple layers over large area substrates to form solar cells in a high volume, continuous processing system. Such continuous processing systems are disclosed in the following U.S. Pat. No. 4,400,409, for A Method of Making P-Doped Silicon Films And Devices Made Therefrom; U.S. Pat. No. 4,410,588, for Continuous Amorphous Solar Cell Deposition And Isolation System And Method; U.S. Pat. No. 4,542,711, for Continuous Systems For Depositing Amorphous Semiconductor Material; U.S. Pat. No. 4,492,181, for Method And Apparatus For Continuously Producing Tandem Amorphous Photovoltaic Cells; and U.S. Pat. No. 4,485,125 for Method And Apparatus For Continuously Producing Tandem Amorphous Photovoltaic Cells. As disclosed in these patents the disclosures of which are incorporated herein by reference, a substrate may be continuously advanced through a succession of deposition chambers, wherein each chamber is dedicated to the deposition of a specific semiconductor material. In making a solar cell of p-i-n type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy.

Since each deposited semiconductor alloy, and especially the intrinsic semiconductor alloy, must be of high purity: (1) the deposition environment in the intrinsic depositon chamber is isolated, by specially designed gas gates, from the doping constituents within the other chambers to prevent the diffusion of doping constituents into the intrinsic chamber; (2) the substrate is carefully cleansed prior to initiation of the deposition process to remove contaminants; (3) all of the chambers which combine to form the deposition apparatus are sealed and leak checked to prevent the influx of environmental contaminants; (4) the deposition apparatus is pumped down and flushed with a sweep gas to remove contaminants from the interior walls thereof; and (5) only the purest reaction gases are employed to form the deposited semiconductor materials. In other words, every possible precaution is taken to insure that the sanctity of the vacuum envelope formed by the various chambers of the deposition apparatus remains uncontaminated by impurities, regardless of origin.

The layers of semiconductor material thus deposited in the vacuum envelope of the deposition apparatus may be utilized to form a photovoltaic device including one or more p-i-n cells, one or more n-i-p cells, a Schottky barrier, photodiodes, phototransistors, or the like. Additionally, by making multiple passes through the succession of deposition chambers, or by providing an additional array of deposition chambers, multiple stacked cells of various configurations may be obtained.

As is obvious from the foregoing, thin film amorphous semiconductor materials offer several distinct advantages over crystalline materials, insofar as they can be easily and economically fabricated by the newly developed mass production processes. However, in the fabrication of semiconductor material by the aforementioned processes, the presence of current-shunting defects has been noted. These defects have (1) seriously impaired the performance of the photovoltaic devices fabricated therefrom and (2) detrimentally affected production yield. These process-related defects are thought to either (1) be present in the morphology of the substrate electrode, or (2) develop during the deposition of the semiconductor layers. It is to the end of eliminating, or at least substantially reducing the effects of these current-shunting defects to which the instant invention is directed.

The most important of these defects may be characterized as "shunts", "short-circuits", defect regions, or low resistance current paths. Before the suspected causes of these defects are explained, it is helpful to note the thicknesses of the deposited semiconductor layers. A typical "p" layer may be only on the order of 250 angstroms thick, a typical "i" layer may be only on the order of 3,500 angstroms thick, and a typical "n" layer may be only on the order of 250 angstroms thick, thereby providing a total semiconductor body thickness of only about 4,000 angstroms. It should therefore be appreciated that irregularities, however small, are not easy to cover by the deposited semiconductor layers.

Shunt defects are present when one or more low resistance current paths develop between the electrodes of the photovoltaic device. Under operating conditions, a photovoltaic device in which a shunt defect has developed, exhibits either (1) a low power output, since electrical current collected at the electrodes flows through the defect region (the path of least resistance) in preference to an external load, or (2) complete failure where sufficient current is shunted through the defect region to "burn out" the device.

While shunt-type defects always deleteriously affect the performance of photovoltaic devices, their effect is greatest when the devices in which they are incorporated are operated under relatively low illumination, such as room light, vis-a-vis, high intensity illumination such as an AM-1 solar spectrum. Under room light illumination, the load resistance of the cell (i.e., the resistance under which the cell is designed to operate most efficiently) is comparable to the shunt resistance (i.e., the internal resistance imposed by the defect regions), whereas under AM-1 illumination, the load resistance is much lower by comparison. Furthermore, in a photovoltaic device, photogenerated current increases linearly with increasing illumination, while the resulting voltage increases exponentially. In other words, voltage attains a relatively high value under low illumination, the value increasing only slightly as the intensity of the illumination is increased. The result is that under low illumination the relatively high voltage potential present preferentially drives the relatively small number of photogenerated current carriers through the path of least resistance, i.e., the low resistance defect regions. In contrast thereto, under high illumination, a large number of current carriers are present and are driven by a potential of about the same magnitude as the potential which exists under low illumination. This larger number of current carriers compete for a limited number of least resistance paths (through the defect regions). The result is that at high intensity, while more power may be lost to the defect region, the power lost is a smaller percentage of the total power produced than at low intensity illumination.

Defects or defect regions, the terms being interchangeably used herein, are not limited to "overt" or "patent" short circuit current paths. In some cases, the adverse effects of a defect are latent and do not immediately manifest themselves. Latent defects can give rise to what will be referred to hereinafter as an "operational mode failure", wherein a photovoltaic device, initially exhibiting satisfactory electrical performance, suddenly fails. The failures will be referred to in this application as operational mode failures regardless of whether the device was previously connected to a load for the generation of power, it only being necessary that the device was, at some time, subjected to illumination, thereby initiating the generation of carriers. This type of failure will be discussed in further detail hereinbelow. It is believed the shunt defects, both latent and patent, arise from one or more irregularities in the (1) morphology of the substrate material, or (2) in the growth of the semiconductor layers.

The first, and perhaps most important, source of the defects, i.e., the aforementioned morphological irregularities in the deposition surface of the substrate material will now be discussed. Even though the highest quality stainless steel is employed to serve as the substrate or base electrode upon which the semiconductor layers are successively deposited, it has been calculated that from 10,000 to 100,000 irregularities per square centimeter are present on the deposition surface thereof. Such irregularities take the form of projections, craters, or other deviations from a smooth finish and may be under a micron in (1) depth below the surface, (2) height above the surface, or (3) diameter. Regardless of their configuration or size, such defects may establish a low resistance current path through the semiconductor body, thereby effectively short-circuiting the two electrodes. This may occur in numerous ways. For instance, a spike projecting from the surface of the substrate electrode may be of too great a height to be covered by the subsequent deposition of semiconductor layers and therefore, be in direct electrical contact with the other electrode when that electrode is deposited atop the semiconductor layers. Likewise, a crater formed in the surface of the substrate electrode may be of too small a size to be filled by the subsequent deposition of semiconductor layers and therefore, be in sufficient proximity to the other electrode, when that electrode is deposited atop the semiconductor layers. In such an instance: (1) electrical current may bridge the gap which exists between the electrodes, or (2) during actual use (the photoinduced generation of electrical current) of the photovoltaic device, the material of one of the electrodes may, under the influence of the electrical field, migrate toward and contact the other of the electrodes, so as to pass electrical current therebetween and thereby give rise to an operational mode failure. It is also possible that in some cases the semiconductor layers deposited onto the substrate include regions of irregular composition which can provide low resistance paths for the flow of electrical current between the electrodes of the photovoltaic device.

Further, despite all the previously described efforts to maintain the vacuum envelope free of external contaminants, dust or other particulate matter which either (1) invades the vacuum envelope during the deposition of the semiconductor material, or (2) forms as a by-product of the deposition process, may be deposited over the substrate electrode along with the semiconductor material. Such contaminants interfere with the uniform deposition of the semiconductor layers and may establish low resistance current paths therethrough.

Additionally, it is suspected that in some cases, the semiconductor material may form micro-craters or micro-projections during the deposition thereof, even absent the presence of contaminants or external pollutants. Such morphological deviation from a perfectly smooth and even surface means that the substrate is covered by semiconductor material either (1) in an "ultra thin layer" (consider again that the total thickness of all semiconductor layers is only on the order of 4,000 angstroms and any reduction in coverage is indeed an ultra thin layer) or (2) not at all. Obviously, when the upper electrode material is deposited across the entire surface of the semiconductor body, the thin or open regions thereof create a low resistance current path. In still other cases, the presence of defect regions is only detectable by their deleterious effect upon the electrical and photoelectric properties of the resultant photovoltaic device. Finally, note that while the defects described hereinabove may, in some instances, not be sufficiently severe to divert all electrical current through the low resistance path, the diversion or shunting of any current therethrough results in some loss in operational efficiency of the photovoltaic device. Moreover, the shunting of even small amounts of current through each of thousands of defect regions will aggregate to cause major losses in efficiency. Based upon the foregoing, it should be apparent that a reduction in current flow through defect regions is critical to the fabrication of high-yield, high efficiency, large area, thin film photovoltaic devices.

Several approaches for dealing with this problem have been implemented by Applicants and their colleagues. As described in U.S. Pat. No. 4,451,970, to Masatsugu Izu and Vincent Cannella, entitled "System and Method For Eliminating Short Circuit Current Paths In Photovoltaic Devices," said patent assigned to the assignee of the instant application, the shunting of current through defect regions is cured by substantially eliminating the defect regions as an operative area of the semiconductor device. This is accomplished in an electrolytic process where electrode material is removed from the periphery of the defect site, effectively isolating the defect regions and preventing the flow of electrical current through the defect region. However, the process described in the '970 patent is current dependent, i.e., the greater the current flowing through a particular area of the device, such as a defect region, the greater the amount of electrode material (in the preferred embodiment indium tin oxide) is removed. Consequently, said short circuit eliminating process performs admirably in removing the electrode material from the periphery of a large defect, and thereby preventing all current flow therethrough. However, it is not as successful in eliminating the flow of current between the electrodes in the thousands of defect regions which are relatively small. And, as previously mentioned, since a great many of relatively small current shunting paths, taken in toto, divert a substantial amount of current from its desired path of travel such small defect regions must also be eliminated or at least substantially reduced. Further, the electrolytic process described in the '970 patent neither detects nor helps in preventing the formation of current-shunting paths in the case of operational mode failures.

In U.S. Pat. No. 4,419,530 of Prem Nath, entitled "Improved Solar Cell And Method For Producing Same", and assigned to the assignee of the instant patent application, there is described a method for electrically isolating small area segments of an amorphous, thin film, large area photovoltaic device. This isolation of defects is accomplished by (1) dividing the large area device into a plurality of small area segments, (2) testing the small area segments for electrical operability, and (3) electrically connecting only those small area segments exhibiting a predetermined level of electrical operability, whereby a large area photovoltaic device comprising only electrically operative small area segments is formed.

While the method of Nath is effective in reducing or eliminating the effect of defects, it is not completely satisfactory for several reasons.

The step of dividing the semiconductor body of the solar cell into electrically isolated portions requires several production steps and also reduces the total area of the solar cell that is available for producing electrical energy. Further, the method can be time and cost intensive since the electrical output of each isolated portion must be tested and separate electrical connections must be made to provide electrical contact to each small area segment. Also, since an entire segment is effectively eliminated from the final cell if it manifests a defect, losses of efficiency are greater than they would be if only the precise area of the particular defect were eliminated. In addition, since it is possible that defects (shorts) in a solar cell can develop after the cell has been in use, the concept of dividing the body of the large area cell does not make compensation for this type of defect.

Further, both of the foregoing patent applications relate to "after market" techniques which are applicable to (1) isolate only gross defect-containing regions and (2) prevent any and all current flow through those defect containing regions. Accordingly, a need still exists for a photovoltaic device which substantially eliminates the deleterious effects of shunt defects, both large and small, whatever their origin, without operatively removing large portions of the active semiconductor body while maintaining an acceptable level of current flow across the entire surface of the device.

One such method is disclosed in commonly assigned U.S. Pat. No. 4,590,327 of Nath, et al, entitled "Photovoltaic Device and Method", which was filed on Sept. 24, 1984, the disclosure of which is incorporated herein by reference. Disclosed therein are several configurations of grid patterns for photovoltaic devices designed to minimize the effects of shorts, shunts, and other defects upon the performance thereof. Disclosed herein are further configurations of photovoltaic devices exhibiting a high degree of operational tolerance to the presence of defects therein.

BRIEF DESCRIPTION OF THE INVENTION

There is disclosed herein a photovoltaic device which includes a substrate having a semiconductor body disposed thereupon and current collection means such as a bus grid structure disposed in superposed relationship with the topmost surface of the semiconductor body for collecting and carrying electrical current generated by the photovoltaic device. The current collection means has current flow restricting means associated with at least a portion thereof for restricting the flow of electrical current between those portions of the current collection means and the underlying portions of the semiconductor body. The photovoltaic device also includes a transparent, electrically conductive layer overlying and in electrical contact with a least a portion of the semiconductor body and current collection means. The photovoltaic device of the instant invention is tolerant of defects such as shorts and shunts because the current flow restricting means prevents the flow of significant amounts of current between the current collection means and any defects occuring in the semiconductor body directly therebeneath; similarly, the effect of defects in the semiconductor body at a point remote from the bus grid structure will be mitigated by the necessity for current from such defects to assume a lateral path of travel through the transparent conductive layer of the photovoltaic device. In this manner the lateral resistivity of the transparent conductive layer will act as a current limiting resistor so as to mitigate the effect of the short circuit current path.

In one embodiment of the instant invention the current flow restricting means comprises a layer of low electrical conductivity material disposed between at least a portion of the current collection means and the underlying semiconductor body. The low conductivity material may be chosen from the group consisting essentially of electrical insulators, wide band gap semiconductors, cermets, and various combinations thereof. In some cases the semiconductor body may be a multilayered semiconductor structure and the topmost layer thereof may be provided as a relatively high resistivity semiconductor layer which will function as a current flow restricting layer.

In another embodiment of the instant invention, the current collection means is a bus grid structure which includes a plurality of grid fingers for collecting photogenerated current and a bus bar structure in electrical communication with the grid fingers for carrying collected current from the fingers to one terminal of the photovoltaic cell. According to the principles of the instant invention, in some instances the entirety of the bus grid structure may be substantially electrically isolated from the underlying semiconductor body by the current flow restricting layer while in other instances it will be desirable to only isolate the bus bar structure itself insofar as it is this structure which carries relatively high amounts of currents.

In those instances where the grid fingers are not provided with a current flow restricting layer thereneath, it may be desirable to utilize grid fingers having a restricted current carrying capacity. Typically, the current carrying capacity of the grid fingers will be limited to a value which is no greater than approximately five times the amount of current that would be expected to be collected by that grid finger from the photovoltaic device under normal operating conditions; in this manner, the grid finger serves to prevent large amounts of current such as would result from a defect, from flowing therethrough. The current carrying capacity of the grid finger may be limited by (1) making the grid finger itself from a resistive material, (2) connecting the grid finger to its associated bus bar by means of a resistive link or (3) connecting the grid finger to its respective bus bar by means of a fusible link which will melt and open the circuit should high levels of current flow therethrough.

There is also disclosed herein methods for the manufacture of the improved, defect tolerant photovoltaic devices of the instant invention.

DETAILED DESCRIPTION OF THE DRAWINGS

Figure 1:
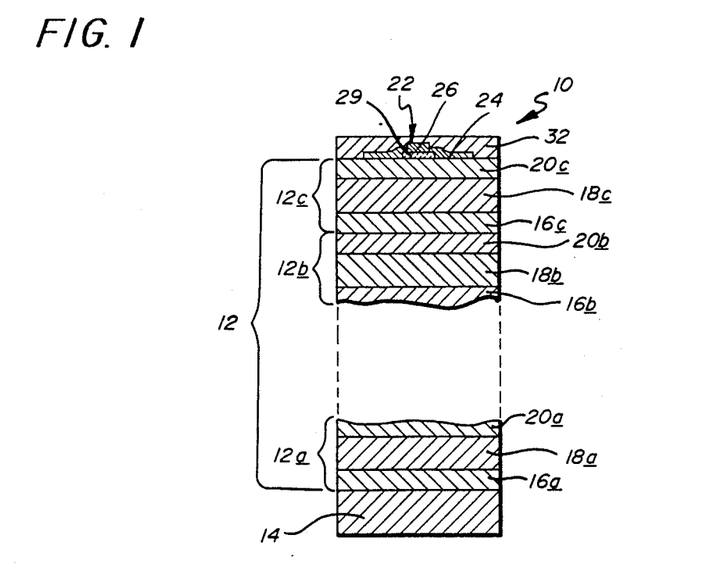
FIG. 1 is a fragmentary, cross-sectional view of a tandem photovoltaic device structured in accord with the principles of the instant invention and comprising a plurality of p-i-n type photovoltaic cells.

Referring now to the drawings, where like reference numbers designate like structure, and particularly to FIG. 1, a stacked, tandem, or cascade-type photovoltaic device, formed of successive p-i-n layers each including an amorphous semiconductor alloy, is shown generally by the reference numeral 10. One of the methods of the present invention is, in the preferred embodiment, adapted to produce an improved photovoltaic device of this type. However, that method and other methods, also described herein, are not limited solely to the production of stacked p-i-n photovoltaic cells, but are of equal value in the production of any other type of thin film solar cells, such as, for example, n-i-p devices, p-n devices, Schottky barrier devices, MIS (metal-insulator-semiconductor) type cells, or simply the production of improved thin film semiconductor devices. Regardless of cell type, the novel production methods described herein have their greatest utility in connection with photovoltaic devices formed with uniform layers of semiconductor materials and with a uniform, continuous transparent conductive layer deposited over the semiconductor layers.

It is to be understood that in accordance with the invention, the semiconductor body of the depicted photovoltaic device may be fabricated from any suitable semiconductor material. Suitable semiconductor materials are those which can be formed into thin films and include, by way of example only, and not as a limitation on the present invention, silicon based, germanium based, cadmium sulfide based, and cadmium tellurium based semiconductor materials.

FIG. 1 shows a tandem photovoltaic device 10, which includes a semiconductor body 12 consisting of a plurality of p-i-n photovoltaic cells 12a, 12b, and 12c. Below lowermost cell 12a is a substrate 14 which may be an electrically conductive metallic member such as a stainless steel sheet, or a thin metallic foil, or which may be formed from an electrically insulating material such as glass, plastic and the like, and provided with an electrically conductive member upon at least a portion thereof.

Although certain applications may require a thin oxide layer and/or a series of base contacts deposited upon the electrically conductive member prior to deposition of the semiconductor material, for purposes of this application, the term "substrate" shall also include any elements added thereto by preliminary processing.

As illustrated, each of cells 12a, 12b, and 12c includes a semiconductor body containing at least a silicon alloy. Each of the alloy bodies includes a p-type region or layer (16a, 16b, or 16c); an intrinsic region or layer (18a, 18b, or 18c); and an n-type region or layer (20a, 20b, or 20c). As illustrated, cell 12b is an intermediate cell and, as indicated in FIG. 1, additional intermediate cells may be stacked atop the illustrated cells without departing from the spirit or scope of the present invention. Also, although stacked p-i-n cells are illustrated, this invention is equally adapted for single or stacked n-i-p cells.

For each of cells 12a, 12b, and 12c, the p-type layers are characterized by low light absorption, high conductivity alloy layers. The intrinsic alloy layers are characterized by an adjusted wavelength threshold for a solar photoresponse, high light absorption, low dark conductivity and high photoconductivity, and include sufficient amounts of a band gap adjusting element or elements to optimize the band gap for the particular cell application. Preferably, the intrinsic layers are band gap adjusted to provide cell 12a with a lowest band gap, cell 12c with the highest band gap, and cell 12b with a band gap between the other two. The n-type layers are characterized by low light absorption, high conductivity alloy layers. The thickness of the n-type layers is preferably in the range of about 25 to 500 angstroms. The thickness of the band gap adjusted, amorphous intrinsic alloy layers is preferably between about 2,000 angstroms to 30,000 angstroms. The thickness of the p-type layers is preferably between 25 to 500 angstroms. Due to the shorter diffusion length of the holes, the p-type layers generally will be as thin as possible. Further, the outermost layer, here n-type layer 20c, will be as thin as possible to avoid absorption of light and need not include the band gap adjusting element or elements.

Figure 2:
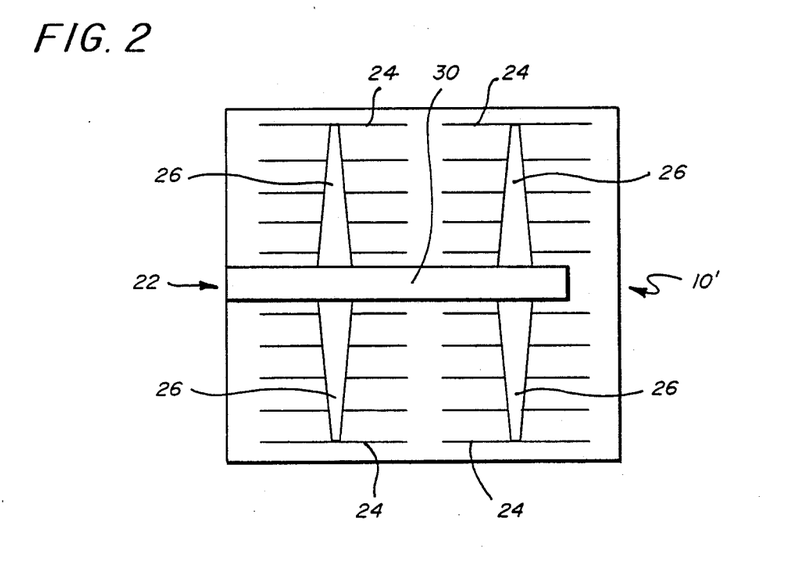
FIG. 2 is a top plan view of photovoltaic device of the instant invention, illustrating the bus grid structure thereof.

It is a notable feature of the instant invention that current collection means such as a bus grid structure 22 is applied either (1) directly over semiconductor body 12, or (2) separated from the semiconductor body 12, at least in part by a layer of relatively high electrical resistivity material 29. Bus grid structure 22 includes a current collecting portion, consisting of grid fingers 24 and a current carrying portion, consisting of a busbar structure 26. FIG. 2, a top plan view of a photovoltaic device 10', generally similar to the photovoltaic device 10, of FIG. 1, illustrates the bus grid structures more fully. It will be noted from an inspection of the figure that the bus grid structure 22 includes a plurality of grid fingers 24, adapted for collecting current and conveying that current to a bus bar system. The grid fingers 24 communicate directly with a plurality of minor bus bars 26, which in turn are connected to major bus bars 30, adapted to carry the photogenerated currents to a terminal of the device 10. The bus-grid structure may be formed from various materials known to those skilled in the art, such materials including: electrically conductive ink, electrically conductive paste, electroplated metals, electroless plated metals, vacuum deposited metals, adhesively affixed metal foils and combinations thereof applied by appropriate techniques.

Following the deposition of the bus grid structure in accord with the principles of the instant invention, a further deposition process may be either performed in a separate environment or as a part of a continuous process. In this step, a transparent electrically conductive layer 32, formed in one embodiment of indium tin oxide, also referred to herein as the top or second electrode, is deposited over the semiconductor material. Many other transparent conductive materials such as zinc oxide, cadmium stannate, tin oxide, and indium oxide are known to skilled practicioners and may also be suitably employed to form the conductive layer 32.

It should be noted particularly that the bus grid structure 22 is located between the transparent conductive layer 32, and the semiconductor body 12. If a defect such as a short or low resistance current path occurs in the semiconductor body 12, that current must travel laterally through the conductive layer 32, to reach the bus grid structure 22. In this manner, and as will be explained in greater detail hereinbelow, the amount of current that can be shorted through that defect is thereby limited, and the derogatory effect of defects upon the performance of the photovoltaic cell is minimized or eliminated.

While the cell illustrated in FIG. 1 is a stacked assembly of p-i-n cells, the instant invention is also applicable to other cell arrangements such as single p-i-n cells, stacked or single n-i-p cells, p-n cells, Schottky barrier cells, and the like. Accordingly, in the description and claims which follow, the layer or layers of semiconductor material disposed between substrate 14 and the bus grid structure 22 will be generally referred to as the "semiconductor body;" this term is intended to include combinations of semiconductor layers of various conductivities and materials which will provide for a flow of electrical current when appropriately combined with one or more electrodes. This flow of electrical current is specifically defined to include the switching of current accomplished by photodiodes and phototransistors, as well as the generation of and collection of current accomplished by photovoltaic devices such as solar cells. Regardless of its ultimate configuration, it is for the purpose of substantially reducing the rate of flow of current through low resistance current paths between the substrate electrode and the top electrode that the instant invention was developed.

Regardless of the exact manner in which the current-shunting defects arise, the defects manifest themselves as short circuit regions wherein low resistance current paths are formed between the second electrode or transparent conductive layer and the substrate electrode of a photovoltaic device. These defects may also be latently manifested by sudden catastrophic failure under operating conditions of the photovoltaic device. The present invention is successful in substantially reducing or eliminating the current shunting effects of both of said patent and latent defects.

Figure 3:
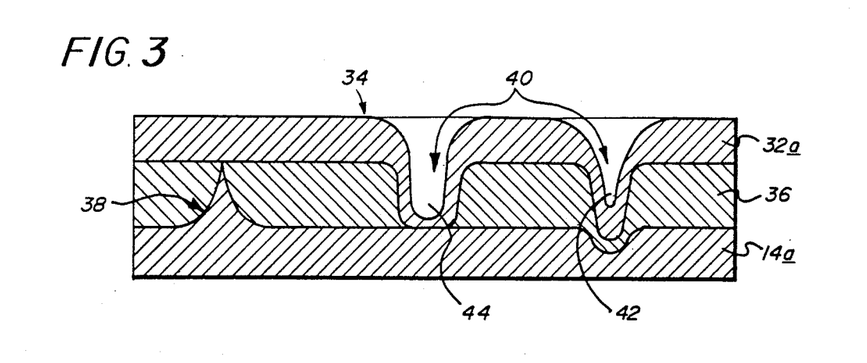
FIG. 3 is a cross-sectional view of a portion of a photovoltaic device illustrating various types of defects therein.

The formation and effect of said defects will be better understood by reference to FIG. 3 which illustrates a portion of a photovoltaic device 34 including a substrate 14a, an active semiconductor body 36, and a transparent conductive layer 32a. A first defect region is depicted by a raised protuberance or spike 38 associated with and extending from the deposition surface of substrate 14a. Raised spike 38 may result from, inter alia, (1) metallurgical irregularities such as impurities, inclusions, columnar growth, etc. in the material from which substrate 14a is formed, (2) mechanical damage due to nicks, abrasions, etc. occuring during handling of substrate 14a, (3) dust or other particulate matter contaminating the surface of substrate 14a during handling, processing, etc. thereof. Spike 38 is of sufficient height so as to be either incompletely or inadequately covered by the subsequently deposited layers making up the semiconductor body 36. In this manner, a defect region is formed in the immediate vicinity of the spike 38, which provides a low resistance current path between conductive layer 32a and substrate 14a since the thickness, if any, of the semiconductor body 36 separating the two electrodes is insufficient to prevent current from shunting therebetween.

A second illustrated defect region is formed in the immediate vicinity of a crater, generally 40, which can originate in either (1) substrate 14a, or (2) semiconductor body 36 of photovoltaic device 34. As herein defined, "craters" include depressions in (1) the deposition surface of substrate 14a, or (2) regions of photovoltaic device 34 onto which insufficient semiconductor material is deposited, thereby causing conductive layer 32a and substrate 14a to either (1) electrically approach, or (2) come into direct electrical contact with one another. Causes of such craters 40, which may also be referred to as pin holes or pits, may include (1) metallurgical or chemical irregularities in the surface of the substrate 14a, (2) impurities and inclusions in the semiconductor body 36, or (3) nonuniform deposition of the semiconductor layers or defective growth of the semiconductor body. Regardless of how crater 40 originates, deposition of the transparent conductive material 32a (in one embodiment, indium tin oxide) over a portion of the semiconductor body 36 having crater 40 formed therein, results in the electrode material at least being partially deposited thereinto. A low resistance current path is thereby established between substrate 14a and conductive layer 32a through which electrical current is diverted from its normal path of travel through semiconductor body 36 of photovoltaic device 34. In FIG. 3, a crater formed due to a defect in substrate 14a is illustrated by reference numeral 42, while a crater formed due to nonuniform deposition of semiconductor body 36 is illustrated by reference numeral 44.

A third type of defect (not shown) which can arise is poor quality regions of the semiconductor body. These regions, which may be of improper morphology, composition or defective growth, exhibit low electrical resistivity relative to the remainder of the semiconductor body, and can thus provide a low-resistance current path between electrodes of the device.

Referring now to the previously mentioned "operational mode failures," said failures are manifested by a sudden catastrophic inability of the photovoltaic device to function under normal operating conditions even though the device has actively generated current for some period of time. Applicants believe operational mode failures result from a current or voltage driven reaction which exacerbates or intensifies latent defects existing in the photovoltaic device. Extremely high current densities are readily attained across defect sites having low resistivities. For example, a one micron square defect having a potential of one volt imposed thereacross could reach a current density of 100 Amperes/$cm^2$ which would destroy the device. Further, it is possible that under the influence of the electrical field developed between conductive layer 32a and substrate 14a when photovoltaic device 34 is operatively employed to produce electrical energy from incident light energy, electrode material may migrate across a defect site such as crater 40 or protuberance 38. Since the defect site is incompletely filled or covered upon deposition of the semiconductor material, even very slight migration may be sufficient, over a periodof time, to establish a low resistivity current path through that defect site, effectively short circuiting the device. Once such a low resistance current path is established, under low intensity illumination, large amounts of current L-an readily flow therethrough and damage the overall operation of the photovoltaic device. Another possible explanatlon for operational mode failure might involve Joule heating and the resultant degradation of the semiconductor material proximate a defect region as current flows through that defect region.

Regardless of the cause and/or nature of the defects, the present invention substantially prevents the free flow of electrical current througn these defect regions to the bus grid system. Thus, the instant invention provides for a defect tolerant photovoltaic devlce.

Figure 4:
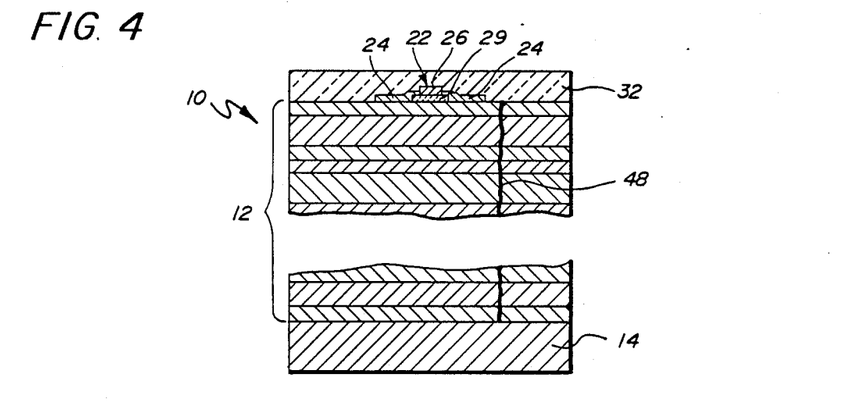
FIG. 4 is a cross-sectional view of a photovoltaic device of the instant invention, generally similar to the photovoltaic device of FIG. 1, but including a low resistance defect therein; and, FIG. 5 is a cross-sectional view of a prior art photovoltaic device including a low resistance defect region therein.
Figure 5:
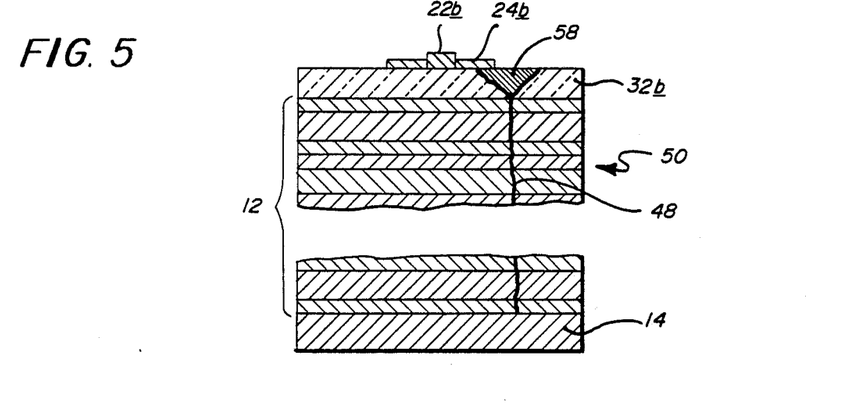

The instant invention and its function will best be understood with reference to FIGS. 4 and 5. FIG. 5 depicts a prior art photovoltaic cell 50 which is generally similar to the cell 10 depicted in FIG. 1 with the exception that the bus grid pattern 22b is disposed atop the transparent conductive electrode 32b. Other portions of the photovoltaic cell 50 are similar to those depicted in FIG. 1 and will accordingly be referred to by similar reference numerals. It will be noted that the ph tovoltaic device 50 includes therein a defect region which establishes a low resistance current path 48 from the substrate electrode 14 through the semiconductor body 12 to the transparent conductive electrode 32b. Since the lateral resistivity of the semiconductor body is relatively high, current traveling therethrough will not spread, but will take the path of least resistance and confine itself to a relatively narrow path 48. (It should be noted at this point that the vertical scale of the drawing is greatly exaggerated for purposes of illustration, with the total thickness of the photovoltaic device generally being 10,000 angstroms or less). When the electrical current flowing through the low resistivity current path 48 encounters the material of the transparent conductive electrode 32b it tends to "fan out" because the lateral resistivity thereof is lower. This fanning out increases the effective size of the defect region, as is represented by the shaded region 58 depicted in FIG. 5. In this manner, a defect which is not in direct alignment with portions of the bus grid structure 22b may still electrically communicate readily with said structure. Since the bus grid structure forms a low resistance network electrically connecting the entirety of the upper surface of the photovoltaic cell, a short circuit between a given portion thereof and the substrate electrode 14 will effectively short circuit the entire photovoltaic cell through that defect.

Referring now to FIG. 4, a photovoltaic cell structured in accord with the principles of the invention is depicted by the reference numeral 10. The cell 10 is generally similar to that depicted in FIG. 1 with the exception that it includes a defect region which establishes a low resistivity current path 48 through the semiconductor body 12 thereof. Because of the fact that the bus grid pattern 22 is disposed beneath the transparent conductive electrode layer 32 in accord with the principles of the instant invention, electrical current flowing through the low resistivity current path 48 will not readily contact portions of the bus grid pattern. In other words, the bus grid pattern 26 is placed in close proximity to the upper surface of the semiconductor body 12, at which point the current path from the defect region has not fanned out and the effective size of the defect region is still relatively small.

It will be appreciated that by control of the resistivity value of the transparent conductive electrode layer 32 the degree of fanning out of electrical current traveling through a short circuit path may be effectively restricted. However, care must be taken to avoid making the transparent conductive material forming the upper electrode 32 too resistive, so as to avoid significantly increasing the series resistance of the photovoltaic device. Accordingly, a compromise must be struck between the resistivity and conductivity of the transparent conductive layer so as to minimize the effect of shorting while maximizing the amount of collected photogenerated current. It has generally been found that a sheet resistance of approximately 150 ohms-square represents a desirable resistivity value for a transparent conductive layer employed in the fabrication of tandem p-i-n type photovoltaic cells formed of amorphous silicon and amorphous silicon:germanium alloy materials, although other values may be appropriate for differently configured cells or for cells fabricated of different semiconductor material.

While disposing the bus grid structure 26 beneath the transparent conductive electrode layer 32 will minimize the effects of low resistance current paths caused by defects, insofar as the effective radius of said defects will be minimized at the level of the grid, defects occurring directly beneath the bus grid structure 22 will not be addressed by this In accord with another principle of the instant invention a low electrical conductivity layer 29 may be disposed beneath portions, or the entirety, of the bus grid structure 22. This layer 29 is formed of a material which (1) is either electrically insulating or (2) has a relatively high resistivity, serves to restrict the current flow between portions of the bus grid structure 22 disposed directly thereabove and those portions of the semiconductor body 12 disposed therebelow. In this manner, low resistance current paths will be prevented from passing significant currents through to overlying portions of the bus grid structure 22. Generally it will be desired that the current flow restricting layer 29 have a sheet resistance of more than 300 ohms/square and preferably a resistance of at least 1000 ohms/square. It is preferred, in some instances, to have the layer of low electrical conductivity material 29, be slightly larger in areas than the superposed portions of the bus-grid structure 22, in order to restrict current flow from defects near the edge of the overlying bus-grid 22. Preferably the layer 29 will be approximately 10–15% longer and wider than the corresponding portions of the bus-grid structure it is protecting.

Among some of the materials having utility for the formation of the current flow restricting layer 29 are electrical insulators such as silicon dioxide, silicon nitride, synthetic polymers and the like, as well as materials having relatively high electrical resistivity such as silicon carbide and other wide band gap semiconductors or cermets. In one particular embodiment of the instant invention the upper layer of the semiconductor body 12, for example the topmost n layer of the p-i-n type cell, may be utilized to form the current flow restricting layer 29, provided that layer has sufficiently high electrical resistivity to prevent large amounts of current from flowing therethrough. It should be noted that in such instances, the semiconductor layer acts as a current limiting resistor; that is to say, it restricts the flow of relatively large amounts of current while only minimally detracting from normal operating current generated by the photovoltaic device.

In most instances it will be desirable to electrically isolate at least the major and minor bus bar portions 26, 30 FIG. 2), of the bus grid structure 22 from the underlying semiconductor body 12 by means of the current flow restricting layer 29 so as to prevent shorting therethrough. It is not always desirable to isolate each of the current collecting grid fingers 24 by such a current flow restricting layer, especially in cases where low series resistance of the resultant photovoltaic cell is desired, for to do so would require that photocurrent generated in the semiconductor body 12 traverse a lateral path through the transparent conductive electrode layer 32 to the grid fingers 22.

In cases where the grid fingers 24 are not provided with a layer of current flow restricting material therebeneath. the principles disclosed in U.S. Pat. No. 4,590,327, referred to hereinabove, may be advantageously employed in conjunction with the principles of the instant invention so as to provide a buffered grid structure which will limit the amount of current flowing from defect regions, through the grid fingers 24 to the bus bars 26 of the bus grid structure 22, and in this manner provide a photovoltaic device tolerant of shorting or shunting. As disclosed in said application, a bus grid structure having current limiting means associated with the grid fingers thereof may be employed to limit the flow of large amounts of electrical current, from short circuit defects and the like. For example, grid fingers may be connected to their corresponding bus bars by the means of a resistive link which acts as a current limiting resistor for restricting the flow of large amounts of current therethrough; similarly, fusible links may be employed to connect the grid fingers to the bus bars, said fusible links adapted to melt and open the connection between the bus bar and grid finger when preselected current levels are exceeded. Preferably, the electrical current carrying capability of the individual grid fingers will be adjusted so that said fingers will be capable of carrying no more than five times the amount current which would be expected to be collected by said finger from regions of the semiconductor body with which it is associated.

The layers forming the semiconductor body 12 of the photovoltaic device 10 structured in accord with the principles of the instant invention may be readily prepared by any method suited for the preparation of thin film semiconductor materials. Among such methods are vacuum deposition techniques including sputtering, evaporation, glow discharge decomposition of a precursor gas, chemical vapor deposition, and the like.

Furthermore, nonvacuum deposition techniques such as electroplating, pyrolytic deposition, etc. may be similarly employed to fabricate the semiconductor layers. There are a wide variety of techniques known and available to skilled artisans for the fabrication of the current flow restricting layer, the ous grid structure and the transparent conductive electrode layer; among these techniques are vacuum evaporation techniques, sputtering techniques, glow discharge decomposition techniques, electroplating techniques, electroless plating techniques, and the like.

It should finally be noted that a photovoltaic device structured in accord with the instant invention is preferably encapsulated in a transparent, protective, electrically insulating material such as a synthetic polymer so as to increase its durability and resistance to ambient atmospheric conditions.

While the instant invention has been described with reference to particular embodiments, it is to be understood that numerous changes, modifications, and substitutions may be made in accord with the principles of the instant invention. The drawings and description thereof are meant to be illustrative of the principles and practice of the instant invention and not limitations thereupon. It is the following claims, including all equivalents, which are meant to define the instant invention.

What we claim is:

1. A photovoltaic device comprising:
   a substrate;
   a semiconductor body having opposed first and second surfaces, said second surface disposed on said substrate;
   current collention means disposed in superposed relationship with the first surface of said semiconductor body, for collecting and carrying current generated by the photovoltaic device;
   a layer of low electrical condutivity current flow restricting material having a sheet resistance of at least 300 ohms/square disposed beneath at least a portion of said current collection means for restricting the flow of electrical current between at least a portion of said current collention means and the underlying portions of said semiconductor body, those portions of the semiconductor body not having said current collection means superposed thereupon being substantially free of said low conductivity material; and,
   a transparent, electrically conductive layer overlying and in electrical contact with at least a portion of the first surface of said semiconductor body and said current collection means.

2. A photovoltaic device as in claim 1, wherein said low electrical conductivity material is chosen from the group consisting essentially of: electrical insulators, wide band gap semiconductors, cermets, and combinations thereof.

3. A photovoltaic device as in claim 1, wherein said low electrical conductivity layer is provided by a portion of the semiconductor body.

4. A photovoltaic device as in claim 1, wherein the sheet resistance of said low electrical conductivity layer is approximately 1000 ohms/square.

5. A photovoltaic device as in claim 1, wherein said transparent electrically conductive layer overlies substantially all of the semiconductor body and current collection means.

6. A photovoltaic device as in claim 1, wherein said transparent, electrically conductive layer is formed from a material chosen from the group consisting essentially of: indium oxide, tin oxide, zinc oxide, cadmium stannate, and combinations thereof.

7. A photovoltaic device as in claim 1, wherein said semiconductor body includes at least one layer of substantially amorphous material.

8. A photovoltaic device as in claim 1, wherein said semiconductor body includes at least one triad of semiconductor layers; said at least one triad including a p-type conductivity semiconductor layer, and an n-type conductivity semiconductor layer and a layer of intrinsic semiconductor material disposed therebetween.

9. A photovoltaic device as in claim 1, wherein said current collection means comprises a bus grid structure which includes a plurality of grid fingers for collecting current and a busbar structure in electrical communication therewith for carrying current collected by said grid fingers.

10. A photovoltaic device as in claim 9, wherein said layer of low electrical conductivity material is disposed between said bus grid structure and the first surface of said semiconductor body.

11. A photovoltaic device as in claim 10, wherein said layer of low electrical conductivity material is approximately 10% to 15% longer and wider than the bus-grid structure.

12. A photovoltaic device as in claim 9, wherein said layer of low electrical conductivity material is disposed between the bus bar structure of said bus-grid structure and the first surface of said semiconductor body.

13. A photovoltaic device as in claim 12, wherein said layer of low electrical conductivity material is approximately 10% to 15% longer and wider than the bus bar structure of said bus-grid structure.

14. A photovoltaic device as in claim 9, wherein at least a portion of said busbar structure is electrically isolated from superposed portions of the transparent electrically conductive layer.

15. A photovoltaic device as in claim 9, wherein the current carrying capability of each of said plurality of grid fingers is approximately five times or less than the amount of current which can be produced by the area of the photovoltaic device for which that particular grid finger collects current.

16. A photovoltaic device as in claim 9, wherein each of said plurality of grid fingers includes a resistive link for establishing electrical communication with said busbar structure.

17. A photovoltaic device as in claim 9, wherein each of said plurality of grid fingers includes a fusible link for establishing electrical communication with said busbar structure.

18. A photovoltaic device as in claim 9, wherein said bus grid structure is formed from a material chosen from the group consisting essentially of: electrically conductive ink, electrically conductive paste electroplated metal, electroless plated metal, vacuum deposited metal, and combinations thereof.

19. A method of fabricating a photovoltaic device comprising the steps of:
providing a substrate;
depositing a semiconductor body having opposed first and second surfaces so that the second surface thereof is disposed upon said substrate;
depositing current collection means in superposed relationship with the first surface of said semiconductor body, said current collection means adapted to collect and carry current generated by the photovoltaic device;
providing a layer of low electrical conductivity current flow restricting material having a sheet resistance of at least 300 ohms/square disposed beneath at least a portion of said current collection means for restricting the flow of electrical current between at least a portion of said current collection means and the underlying portion of said semiconductor body, such that those portions of the semiconductor body not having said current collection means superposed thereupon are substantially free of said low conductivity material; and,
depositing a transparent, electrically conductive layer atop, and in electrical contact with at least a portion of the first surface of said semiconductor body and said current collection means.

20. A method as in claim 19, wherein the step of providing a low electrical conductivity material includes the further step of choosing said material from the group consisting essentially of: electrical insulators, wide band gap semiconductors, cermets and combinations thereof.

21. A method as in claim 19, wherein the step of providing a low electrical conductivity layer comprises depositing a layer of low electrical conductivity semiconductor material which also forms a portion of the semiconductor body.

22. A method as in claim 19, wherein the step of providing a low electrical conductivity layer comprises depositing a layer having a sheet resistance of approximately 1,000 ohms/square.

23. A method as in claim 19, wherein the step of depositing a transparent electrically conductive layer comprises depositing said layer atop substantially all of the semiconductor body and current collection means.

24. A method as in claim 19, wherein the step of depositing a transparent electrically conductive layer includes the further step of depositing a layer of a material chosen from the group consisting essentially of: indium oxide, tin oxide, zinc oxide, cadmium stanate, and combinations thereof.

25. A method as in claim 19, wherein the step of depositing a semiconductor body comprises depositing at least one triad of semiconductor layers, said at least one triad including a p-type conductivity semiconductor layer and n-type conductivity semiconductor layer and a layer of intrinsic semiconductor material disposed therebetween.

26. A method as in claim 19, wherein the step of depositing current collection means comprises depositing a bus-grid structure which includes therein a plurality of grid fingers for collecting photogenerated current and a bus bar structure in electrical communication therewith for carrying current collected by said grid fingers.

27. A method as in claim 26, wherein the step of providing a layer of low electrical conductivity material comprises depositing said layer between said bus-grid structure and an upper surface of said semiconductor body.

28. A method as in claim 26, wherein the step of providing a layer of low electrical conductivity material comprises depositing said layer between the bus bar structure of said bus-grid structure and an upper surface of said semiconductor body.

29. A method as in claim 27, wherein the step of depositing said layer of low electrical conductivity material comprises depositing said material to cover an area approximately 10% to 15% longer and wider than the bus-grid structure.

30. A method as in claim 28, wherein the step of depositing said layer of low electrical conductivity material comprises depositing said material to cover an area approximately 10% to 15% longer and wider than the bus bar structure of said bus-grid structure.

31. A method as in claim 26, including the further step of electrically isolating at least a portion of the bus bar structure from superposed portions of the transparent electrically conductive layer.

32. A method as in claim 26, wherein the step of depositing a bus-grid structure includes the further step of depositing a plurality of grid fingers having a current carrying capacity which is approximately five times or less than the amount of current which can be produced by the area of the photovoltaic devices for which that particular grid finger collects current.

33. A method as in claim 26, including the further step of establishing electrical communication between each of said grid fingers and said bus bar structure with a resistive link.

34. A method as in claim 26, including the further step of establishing electrical communication between each of said grid fingers and said bus bar structure with a fusible link.

35. A method as in claim 26, wherein the step of depositing a bus-grid structure comprises depositing said structure through a techniques chosen from the group consisting essentially of: electroplating, electroless plating, vacuum deposition, stenciling, adhesive fixation of metal foils, and combinations thereof.

* * * * *